United States Patent [19]

Boyd et al.

[11] 4,000,462
[45] Dec. 28, 1976

[54] FAULT INDICATOR CIRCUIT

[75] Inventors: Robert Kent Boyd, Florissant; Allan Walter Lindberg, St. Louis, both of Mo.

[73] Assignee: International Telephone and Telegraph Corporation, New York, N.Y.

[22] Filed: Apr. 10, 1975

[21] Appl. No.: 566,950

Related U.S. Application Data

[63] Continuation-in-part of Ser. No. 399,080, Sept. 19, 1973, Pat. No. 3,895,296.

[52] U.S. Cl. .............................. 324/127; 324/132; 324/133; 340/253 A
[51] Int. Cl.[2] ................. G01R 15/10; G01R 19/14
[58] Field of Search .......... 324/127, 126, 132, 156, 324/133; 340/253 A; 328/142; 307/229

[56] References Cited
UNITED STATES PATENTS

| | | | |
|---|---|---|---|
| 2,198,371 | 4/1940 | Wolferz et al. | 324/127 |
| 3,253,215 | 5/1966 | Moakler et al. | 324/127 |
| 3,281,689 | 10/1966 | Schneider et al. | 324/132 |
| 3,621,392 | 11/1971 | Liebermann | 324/127 |

*Primary Examiner*—R. V. Rolinec
*Assistant Examiner*—Ernest F. Karlsen
*Attorney, Agent, or Firm*—James B. Raden; William J. Michals

[57] ABSTRACT

Disclosed is the physical construction and electrical control circuit of a fault indicator designed to provide a watertight structure for the indicator. One face of the indicator is visible through the sealing apparatus, the sealing apparatus enclosing the structure on all sides other than the indicator face side. The indicator is capable of being submerged and will withstand a water pressure of 8 psig to meet specifications established by electric utilities. The electrical control circuit normally causes the transformer to operate below its saturation level resulting in quick response to changes in input current, and providing improved temperature stability of the control circuit.

8 Claims, 9 Drawing Figures

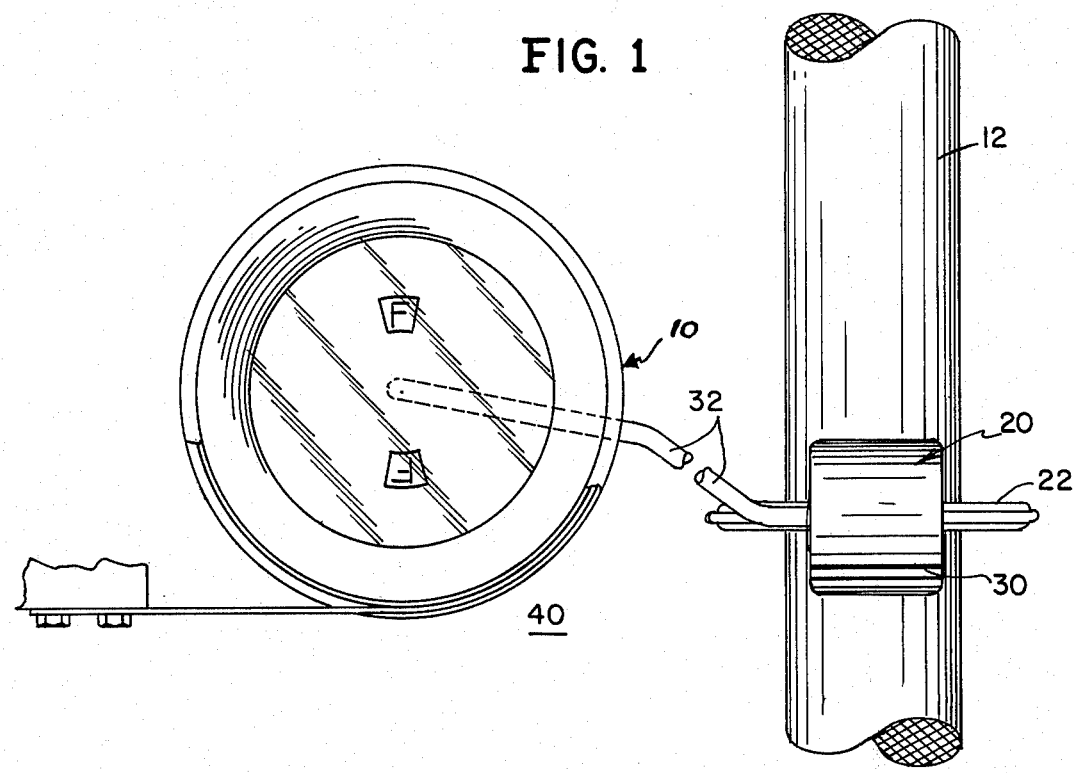
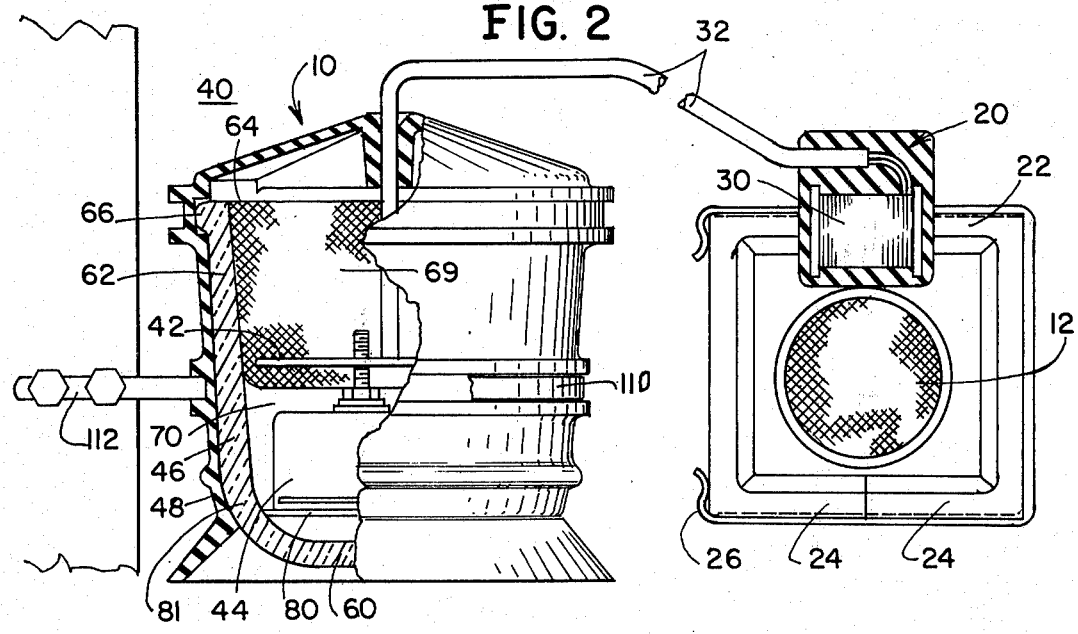

FAULT INDICATOR CIRCUIT

This is a continuation-in-part of application Ser. No. 399,080, filed Sept. 19, 1973, now Pat. No. 3,895,296.

BACKGROUND OF THE INVENTION

This invention relates to a fault indicator circuit for a transformer coupled fault meter for use with a current carrying conductor.

Fault indicators of themselves are well-known in the art. The more recent indicators are self-contained, self-powered elements which include a split core which may be mounted about a conductor being monitored. Connected to the sensing coil on the core by a suitable conductor is the sensing circuitry and indicator. The sensing circuitry in some cases operates the transformer above its saturation level and thus diminishes its sensitivity, speed of response and temperature stability. The sensing circuit is generally mounted with the indicator within a casing. In some known installations, the indicator casing is made of Lexan plastic and surrounded by suitable sealing members. The Lexan plastic, however, has been found to permit moisture migration therethrough, and therefore, failures have occurred. As is well-known in the more recent past, electrical distribution systems, especially for residential use, have been placed underground with transformers and other distribution elements positioned in vaults embedded in the earth. These vaults tend to fill with water on occasion, and submerge the conductor and other elements in the vault. The fault indicator therefore, must be sealed against failure due to submersion. Many forms of sealing structures are known in the art.

SUMMARY OF THE INVENTION

The present invention comprises an electronic circuit for use with an improved fault indicator of the self-contained, self-powered type. The basic housing of the indicator encloses an indicator and an electronic sensor for triggering the indicator.

The electronic circuit responds to current conditions sensed by the transformer primary and responds to an increase in such current speedily and consistently over a wide range of ambient temperature conditions. To ensure the speedy response and temperature stability of the circuit, the secondary of the transformer is loaded with a circuit of low ohmic resistance. The transformer is thereby operated below its saturation level. This form of operation ensures speedy transformer response (in less than ½ cycle). The unit will sense the fault condition before the normal fuse would blow and would provide an indication of the area where the fault occurred.

In the circuit, the change in current is sensed by a silicon bilateral switch to reverse the current to the meter, triggering the meter to a fault indication. The unit automatically resets on restoration of current to the normal level.

BRIEF DESCRIPTION OF THE DRAWING

FIG. 1 is a plan view of an indicator apparatus which utilizes the present invention;

FIG. 2 is a side view in elevation partially broken away showing the indicator of FIG. 1 relative to a cable;

DETAILED DESCRIPTION

Figure 3:
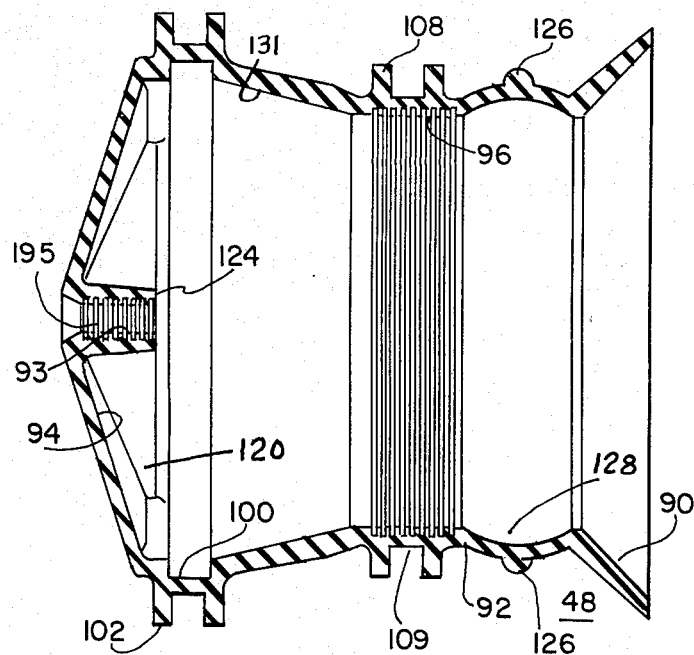
FIG. 3 is a sectional view through the center of the boot in FIG. 2.

In FIG. 1, we show a fault indicator 10 employing our invention and applied to a cable 12, the current passing through which is to be monitored. The indicator 10 includes a split core current transformer 20 of any suitable type known in the art. The transformer core 22 is essentially toroidal and has a diametral split to form two U-shaped core sections 24. The core sections 24 allow the transformer to be fitted about the cable 12. The sections are held together by a suitable open-ended wire/spring bail 26. Mounted on one leg of the core is a sensing winding 30, the winding having a multiple conductor cable 32 connected thereto and extending from the winding for connection to the indicator main element. The cable 32 is covered with rubber or other suitable water-impervious elastomer. The connection of the cable 32 to the winding 30 is effected by sealing the entry of the cable into the winding structure for a suitable length by permanently molding or otherwise sealing the cable 32 to the winding 30.

The main detector unit 40 of the indicator 10 is comprised of four components. These components include an electronic circuit board 42 which terminates the cable 32 and provides the current-sensitive detecting apparatus. The second component of the main unit is the indicating meter 44. The third element, a glass housing 46, suitably encases the meter and circuit board, the housing being enclosed itself within the fourth component, a rubber sealing boot 48.

The glass housing 46 is essentially a cup-shaped, one-piece structure of sufficient thickness to provide structural strength for the unit. We have found that a soda lime glass or boro silicate glass material of approximately 7/32 inch thickness provides the necessary degree of structural strength. The housing 46 has an essentially circular, clearly transparent, face 60 from which a slightly tapering, frusto-conic sidewall 62 extends. The sidewall terminates at an open, circular mouth 64, the mouth being greater in diameter than the diameter of face 60. A raised lip or flange 66 extends radially outwardly from the outer rim of the open-mouthed end of the housing, the lip or flange reinforcing the housing structure.

Figure 5:
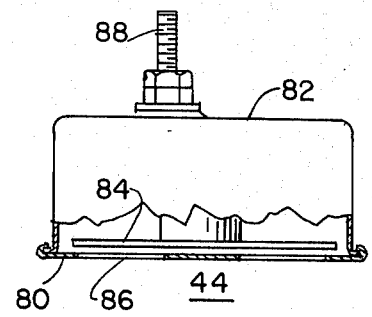
FIG. 5 is a side view of the indicator meter as used herein, the showing of FIG. 5 being broken away to show the interior of the meter.
Figure 6:
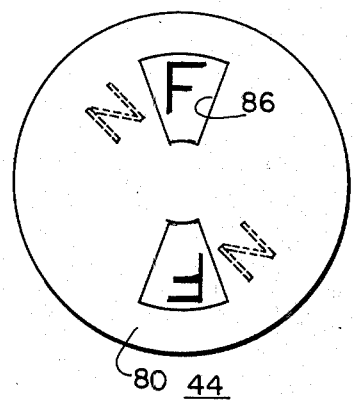
FIG. 6 is a front view in elevation of the face plate of the meter of FIG. 5.

The meter 44 is mounted within the cavity 70 such that the circular disc face 80 of the meter is positioned parallel to and adjacent the housing circular face 60. The meter face 80 has a stationary plate which rests against the curvature of the housing at the junction 81 between the transparent housing face 60 and the sidewall 62. The meter used herein may assume any known form of meter suitable for use in fault indicators. However, we find that a meter of the type shown in FIGS. 5 and 6 may be used satisfactorily for the purpose shown. The meter has a cylindrical body 82 having a stationary face plate with spaced openings therein through which are visible a rotatable disc plate 84 with suitable indicia visible through the openings 86 in the disc 80. The meter has a coil responsive to sensed indications of the cable current to indicate N for normal current and to rotate plate 84 to position the F indications in the area of openings 86 to indicate a fault condition. By firmly connecting a rear mounting member 88 of the meter to the circuit board 42 and by fixing the circuit board firmly in place within the housing, the meter is thereby secured in place to be visible through the face 60 housing of the housing 46. The cable 32 is also secured electrically to the circuit board and extends for a distance through the block 69 of the potting material to provide a sealing relationship between the cable 32 and its connection to the circuit board 42.

Figure 4:
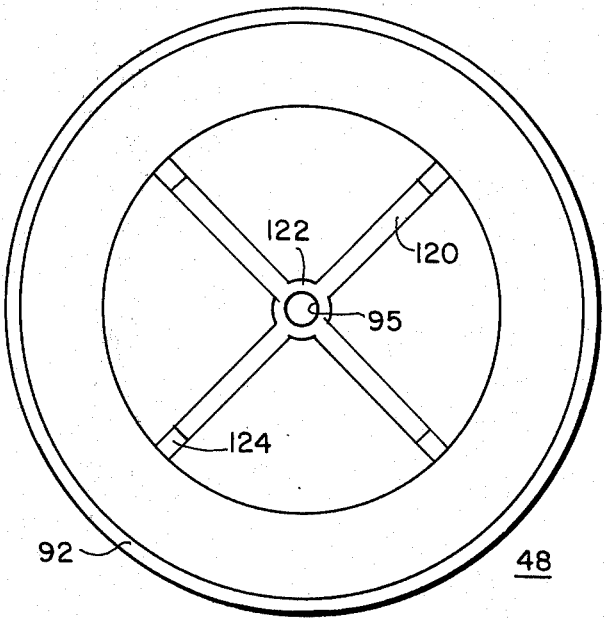
FIG. 4 is a section taken along line 4—4 of FIG. 3.

Secured to the exterior of the housing 46 is the sealing boot 48 shown in greatest detail in the sectional view of the FIG. 4. The boot is a one-piece elastomeric member which is essentially cup-shaped or bell-shaped with a flared open mouth 90. The boot is sized for interference fit with the sidewall of housing 46 along at least one intermediate sidewall area 92 leading to the flared mouth 90 of the boot. The closed end 94 of the boot encloses the open mouth 64 of the housing to house and seal the electric elements within the housing. The mounting of the boot on the housing retains the circular face 60 of the housing exposed to allow the meter face to be visible from the outside of the boot. The essentially imperforate closed end 94 of the cup has a central tubular opening 95 sized to fit tightly about the cable 32.

A series of annular ribs 93 within the cylindrical tubular opening 95 for the cable serve to seal an elongated area of the cable to the housing. The inner wall of the housing 46 has an annular channel 100 adjacent the closed end which mates with the raised lip 66 of the glass housing to firmly position the housing and boot relative to one another and to deter and prevent ready removal of the boot from the housing. This is accomplished by a combination holding ring mounted strap being welded to itself in a channel around the perimeter of the boot in front of the glass flange. The ribs 96 define an area of maximum sealing between the boot and the housing substantially intermediate along the height of the boot sidewall in an area in which the boot makes surface contact with the outer surface of the housing in an area of regular configuration. The inner sidewall of the boot is ribbed annularly through this maximum sealing area. The outer periphery of the boot in this maximum sealing area has a pair of spaced annular ridges 108 forming an annular channel 109 between. The annular channel forms a seat for a holding ring 110, the ring being tightly and permanently affixed in the channel, which helps to create pressure of the boot against the glass for added sealing.

This holding ring 110 may be a ring of stainless steel strap formed circularly and welded at the mating of the strap ends, with a hanger extension 112 protruding from the ring. The hanger extension of ring 110 may be used to anchor the unit to any suitable stationary member. The ring body performs the dual function of preventing axial movement of the boot relative to the housing and tends to hold the boot area of maximum sealing tightly against the adjacent glass housing sidewall. The shape of the sealing boot has been carefully configured in a number of areas. Reinforcing and shock cushioning ribs 120 have been molded or otherwise suitably formed within the closed end of the boot as can be seen in FIGS. 3 and 4. These ribs are angularly spaced to extend radially from a central reinforcement 122 of the tubular cable opening to an abutment 124 adjacent the annular channel 100. These abutments and ribs cushion the end of the glass housing.

Internal ribs 120 mate with the upper surface of the potting compound to prevent flexing of the cable seal under water pressure. Further, under conditions where the unit is submerged, the potting compound acts to form a boot support as well as a final seal between the glass and the cable jacket to prevent water from passing to the circuit and meter. The potting compound tends to flex and maintain its bond and seal over the entire temperature range met by the fault indicator, i.e. $-40°$ C. to $+85°$ C.

Externally, a pair of peripheral ridges 102, serve to reinforce the end of the housing and act as a bumper to cushion the end of the unit against shock. Another peripheral bumper rib 126 about the curved portion 128 of the boot which covers the curved housing junction section 81 acts to cushion shocks received by the base end of the housing along with the boot flared mouth.

The wall thickness of the boot is tapered slightly in the area 96 of maximum sealing to complement the taper of the housing. The taper in the area of numeral 131 complements the draft angle of the glass when the boot is positioned properly so the outside surface of the boot has parallel walls for mounting the strap. Thus, the surface area presented for the strap ring 110 is a cylindrical one allowing the strap to seat smoothly on the boot and not cut into the boot when tightened in place. Likewise, pressure can be applied by the strap distributed around the circumference of the boot for additional sealing strength.

For assembly of the main detector unit, the meter is assembled to the circuit board 42 by means of meter mounting number 88; the interconnecting cable 32 is threaded through the tubular opening and is affixed to the transformer 20. The connection of cable 32 into the transformer is suitably sealed, as shown in FIG. 1. The assembly is sealed within the housing by a waterproof potting compound sealing the mouth of the housing. The compound which we have found to be most successful is a flexible polyurethane sold under the trademark Leepoxy 20-154 by the Leepoxy Plastics Corporation of Fort Wayne, Ind. A mesh paper bag is inserted to allow the compound to set in place and adhere to the glass, to the cable and to the other elements to which exposed.

The meter face 80 is positioned adjacent and substantially parallel to the housing base 60 to render the meter face visible. The boot is slipped over the housing and drawn taut to fit housing flange 66 within the channel 100 and with the boot abutments 124 in contact with the end of sidewall 62 adjacent the housing mouth 64. The curved portion 128 of the boot seats tightly about the housing junction area 81.

The area 96 of maximum sealing is positioned with its ribs in tight sealing surface contact with the adjacent sidewall of the housing. The holding ring 110 is formed and is welded to lock the ring in place and leave the extension 112 free for connection to any suitable surface.

Within the structure as described, the elastomer to glass seal serves as the main and primary seal. A secondary or double seal is formed by the potting compound within the glass. The potting compound also forms a surface for the infringement of ribs 120 and structurally supports the unit for a proper seal.

Figure 7:
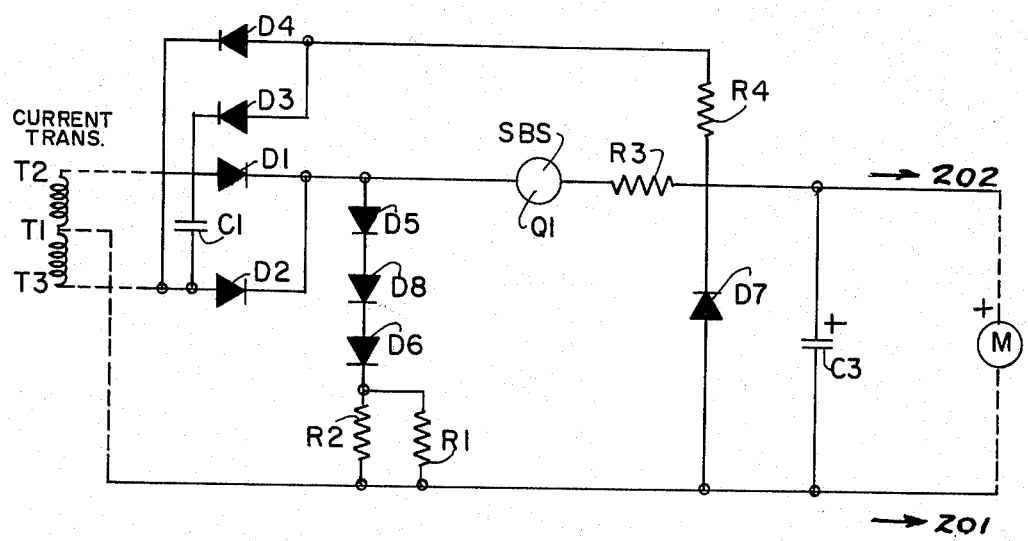
FIG. 7 is a schematic diagram of the sensing circuit in accordance with the present invention.

The electronic circuit of FIG. 7 provides direct current flow through the meter 10 in response to current being sensed by the current transformer 20. The polarity of the meter current is in the direction of arrow 201 when the sensed current is below a set value and reverses to the direction of arrow 202 when sensed current is greater than the set value. The set value is referred to as the fault current setting or trip setting. The bistable meter is positioned to a reading referred to as "normal" with the sensed current flow less than the trip setting. When the sensed current flow is greater than the trip setting, the meter moves to its other state and indicates "fault".

In the operation of the circuit, output from the center tapped current transformer secondary 20 is rectified by two pairs of rectifier diodes. The common cathodes of diodes D1 and D2 provide a positive voltage and the common anodes of diodes D3 and D4 provide a negative voltage in response to sensed current. The positive voltage is applied to a trigger device (Q) and to current shunt resistors R1 and R2 through the diode string D5, D8 and D6. When the sensed current is very low, this positive voltage is low and is below the forward conductor threshold of the series diodes and is also below the breakdown of the trigger so no current flows through this path. For intermediate values of sensed current, the positive voltage is sufficient to make the diode string conduct. The current flowing in the shunt resistors R1 and R2 becomes a measure of the sensed current. As can be seen from the circuit, the voltage of the shunt resistors combined with the forward conduction voltage of the diode string is applied to the terminal of the triggering device. When the net voltage across the trigger device reaches its breakdown value (typically, about eight volts), the trigger becomes conductive and as long as current is maintained, it behaves approximately as though it were a forward biased diode.

The value of the shunt resistors R1 and R2 is very low, the parallel path resistance of R1 and R2 in combination being about 5–60 ohms (dependent on the trip valve of the device). This low resistance provides the device with operation characteristics such that as the sensed current increases to the trip current value, this breakdown voltage is achieved at the crest value of the rectified voltage wave. Once the breakdown is achieved, the flow through the current limiting resistor R3 into the meter circuit is sufficient to move the meter to the "fault" position.

For values of sensed current below the trip value, the meter is positioned to its "normal" reading by the current flow through resistor R4 into the negative voltage point provided by diodes D3 and D4. For intermediate sensed current values, the current flow through the meter circuit creates sufficient voltage drop to forward bias diode D7 to conduction. This conduction stabilizes the voltage on the negative terminal of the trigger Q so that the trigger is properly responsive to the sensed current.

A critical requirement of the device is to provide a resetting of the indicator from "fault" to "normal" with a minimal amount of sensed current, (typically, three amperes). The circuit is very efficient in providing that reset because of low values of sensed current, the said diode string does not conduct and the only current which flows is through resistor R4 and the meter circuit.

The capacitor C3 is provided to smooth out or filter the pulsating current flowing in R4 and when tripped in R3 so that a steady indicator reading is maintained.

Capacitor C1 does two things: It provides a leading power factor load on the current transformer to tune out some of the magnetizing current required by the core. Also, its low impedance at high frequency provides useful reverse voltage protection for the rectifier diodes.

Trigger device Q is a silicon bilateral switch (SBS) of the type sold by the General Electric company (2N4991) as a silicon planar, monolithic integrated circuit having the electrical characteristics of a bilateral thyristor with a temperature stabilized voltage triggering level.

With an apparatus such as that shown herein we have been able to provide a ± 10% stability over an ambient temperature range from −40 ° C. to +85° C. A unit is provided with a basic operating level of 200 amps, 300 amps or 400 amps. Thus for a 200-amp device, we provide a device which normally monitors at the 100 amp level and will respond to excess current at the level of 200 amps or higher, in a short span of time with the actual speed of response being dependent on the amount of excess current over the operating level.

Figure 8:
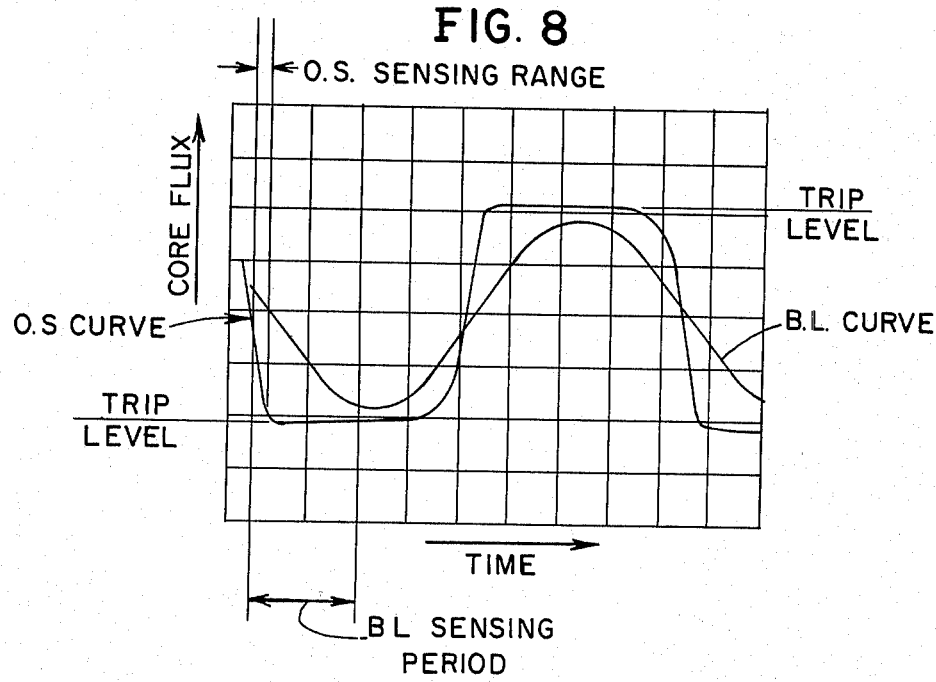
FIG. 8 is a graph of the curve of the response of the transformer of the present invention to change in current as contrasted with other known systems which saturate the transformer core on each half-cycle; and, FIG. 9 is a schematic diagram of an alternate embodiment of the circuit in accordance with the present invention, and further including an improvement thereto which further contributes to stability and sensitivity.

In FIG. 8 is shown the response curve of the present transformer core to currents slightly less than the trip value for which the circuit of FIG. 7 is set viewed against the response time. For example, the graph of FIG. 8 was viewed for units having a 300 amp fault trip value, the curves exhibiting passed current at the 285 amp level. This level is one slightly below the trip value for each unit shown. The curve labeled BL represents the core flux viewed for a circuit as shown in FIG. 7. It can be seen that for each A.C. cycle, the flux follows the sine curve of input current rather closely. Thus, any increase in current will be sensed quickly to increase the flux in a properly speedy manner and to cause the secondary current to respond equally quickly.

Figure 9:
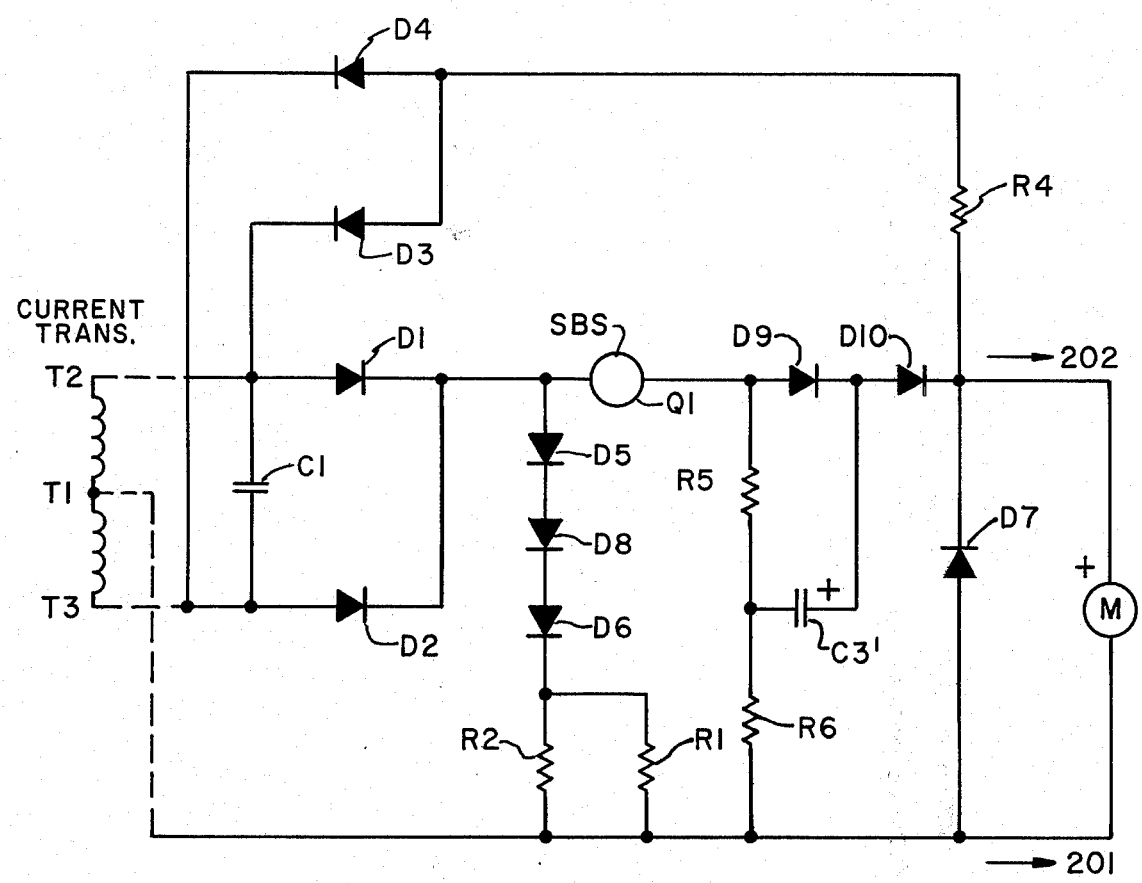

The curve labeled OS is taken using a device of known type which uses resistance of 10 K ohms across the transformer secondary to cause the transformer core to saturate on the amplitude of voltage across the transformer secondary exceeding a predetermined level. The curve labelled OS is saturated quickly on each half-cycle. Therefore, the only period in which an excess of sensed input current can be translated into a voltage increment is the period before saturation. This period is extremely short in duration and the sensing circuit must be extremely sensitive to act on this excess in one or two half-cycles. In the present invention, low resistances R1 and R2 are positioned in parallel between the opposite ends of the transformer secondary and the center tap T1. This secondary loading provides the transformer core response characteristic to a sensed sine wave as shown in FIG. 9. With the transformer core unsaturated, increases in input current such as those due to fault conditions will be detected rapidly to cause the indicator to change to its fault state. The operation at lower than saturated levels plus the comparatively slow build-up of the sine wave provide a considerably longer period to detect the high current of a fault and to react to same.

Thus, the indicator device disclosed provides a high speed of response within a package which may be submerged safely and may endure wide temperature differentials without adversely affecting its response characteristics.

Referring now to FIG. 9, there is shown a schematic diagram of an alternate embodiment of the circuit in accordance with the present invention and further including an improvement thereto. FIG. 9 is similar to FIG. 7 and, accordingly, like elements bear like reference numerals.

The improvement comprises four additional components which function to contribute to the stability and sensitivity of the circuit as discussed more fully hereinafter. The additional components include a pair of diodes D9 and D10 which are serially coupled between trigger switch Q1 and the junction of resistor R4 and diode D7. The other components form a resistive divider comprising resistors R5 and R6 which are serially coupled between trigger device Q1 and a point of reference potential or the center tap T1 of the transformer secondary winding. Capacitor C3' is coupled between the common junction of diodes D9 and D10 and the intermediate point of the resistive divider formed by resistors R5 and R6.

It has been found that although the circuit of FIG. 7 serves quite adequately for its intended purpose, there exists a small range of instability or ambiguity when the circuit is operating in conjunction with conductor current levels very near the set trip level. That is, when the circuit is at or near the threshold of providing a fault indication two interrelated effects give rise to a limitation in stability. The first effect is due to the fact that the capacitor C3 in FIG. 7 becomes charged when trigger device Q1 becomes conductive. Thereafter, as the alternating current waveform of the conductor current passes through zero the trigger device Q1 turns off or commutates. However, a resultant positive voltage is developed and stored across the terminals of capacitor C3. This stored voltage has a "bucking" effect which varies the level at which trigger device Q1 becomes conductive. In other words, after a voltage is stored across capacitor C3 the sensed input voltage applied to trigger device Q1 must be increased by an equivalent amount to assure conduction of device Q1 during the next half-cycle — that is, if the circuit is operating with the conductor current near the set trip level. Similarly, the positive voltage developed across capacitor C3 can back-bias diode D7 such that diode D7 no longer provides the "clamping" or stabilizing function it normally provides at the negative terminal of trigger Q1, as previously described. It has been found that when this situation occurs, which as previously described occurs when the operating current is at or near the set trip level, that trigger device Q1 may turn off prematurely during part of the line current half-cycle and, in some cases, ramain off for a number of succeeding cycles during which it would otherwise become conductive.

Referring again to FIG. 9, it can be seen that diodes D9 and D10 function to isolate the negative terminal of trigger device Q1 from capacitor C3', and provide this isolation over the entire operating range of charge values. Resistors R5 and R6 provide a ground return for the negative side of trigger device Q1. Hence, the triggering level of trigger device Q1 is substantially independent of any positive voltage stored across capacitor C3 which would otherwise have a "bucking" effect thereon.

The resistance of resistor R6 if preferably selected to have a small value relative to the resistance of resistor R5; for example, 6.8 ohms to 270 ohms. Resistor R6 functions to sense any displacement current flowing through capacitor C3'. This displacement current is present when trigger device Q1 has fired on a previous half-cycle such that the voltage capacitor C3' is not at its stabilized value. Accordingly, if trigger device Q1 has fired on a previous half-cycle such that capacitor C3' is charging a negative voltage appears at the terminal of capacitor C3' which is connected to resistor R6 which also reflects a negative voltage at the negative terminal of trigger device Q1. Accordingly, in this manner a more desirable operating condition is achieved. That is to say, with a steady level of conductor line current at or near the set trip level, if trigger device Q1 conducts during any given half-cycle of current, it will necessarily conduct on the next and succeeding half-cycles. Thus, the narrow band of instability, which would otherwise result when the circuit in accordance with the present invention is operated at or near the set trip level, is avoided.

What has been taught, then, is a fault indicator circuit facilitating, notatably, fault detection in power line distribution systems. The form of the invention illustrated and described herein is but a preferred embodiment of these teachings. It is shown as an illustration of the inventive concepts, however, rather than by way of limitation, and it is pointed out that various modifications and alterations may be indulged in within the scope of the appended claims.

What is claimed is:

1. A fault indicator adapted to monitor the current in a current carrying conductor and comprising a current transformer coupled to said conductor, said current transformer including a secondary winding, a rectifier coupled to said secondary winding to provide a unidirectional signal indicative of the current carried by said conductor, a non-linear current sensing circuit coupled to said rectifier to respond to changes in current carried by said conductor, an indicator having a normal indication responsive to current carried by said conductor at a first level and having a fault indication responsive to currents above a second level higher than said first level, means loading the secondary of said transformer to operate below the saturation level of said transformer, said loading means comprising a diode serially coupled with a resistor, and said loading means being coupled in shunt with said secondary winding and wherein said diode is poled so that said diode becomes increasingly conductive as the current carried by said conductor increases and wherein said diode is substantially nonconductive at minimum current levels substantially below said first level.

2. An indicator as claimed in claim 1, wherein said sensing circuit comprises integrated circuit means for converting currents of said second level to voltage signals and for responding to said voltage signals for activating said fault condition.

3. A fault indicator circuit for monitoring fault current in a conductor carrying AC current, said circuit being adapted for coupling to the secondary winding of a current transformer having a primary winding for coupling to said conductor, said circuit providing an output signal for coupling to indicator means responsive to said output signal for providing a normal indication when the current in said conductor is below a predetermined level and a fault indication when the current in said conductor is greater than said predetermined level, said circuit comprising in combination:

input means adapted for being coupled to said secondary winding of said current transformer;
rectifier means coupled to said input means for providing first and second unidirectional signals respectively at first and second terminals thereof;
impedance means coupled between said terminals for providing said output signal at an intermediate point thereof which is indicative of the level of said current in said conductor;
said impedance means including means for varying the relative impedance of said impedance means wherein the impedance between said intermediate point and said first terminal is substantially greater than the impedance between said intermediate point and said second terminal until the level of said current in said conductor exceeds said predetermined level whereupon the impedance between said intermediate point and said second terminal is substantially greater than the impedance between said intermediate point and said first terminal; and,
means coupled to said input means and responsive to the levels of said current for loading the secondary winding of said transformer to prevent saturation of said transformer at current levels below said predetermined level, said means for loading including a threshold device which is substantially nonconductive when the level of said current is at a minimum level which is substantially less than said predetermined level and which becomes conductive as the level of said current increases.

4. The fault indicator circuit according to claim 3, wherein said impedance means includes a threshold device which is substantially nonconductive when the level of said current is less than said predetermined level and which is conductive when the level of said current is greater than said predetermined level.

5. The fault indicator circuit according to claim 3, wherein said means for loading includes at least one diode coupled between said first terminal and a fixed point of reference potential with respect to said first and second signals.

6. The fault indicator circuit according to claim 4, wherein said threshold device of said impedance means is coupled between said first terminal and said intermediate point and further including a capacitor coupled between said intermediate point and a point of reference potential with respect to said first and second signals.

7. In a fault indicator circuit for monitoring fault current in a conductor carrying AC current, of the type adapted for coupling to the secondary winding of a current transformer having a primary winding for coupling to said conductor, and providing an output signal for coupling to indicator means responsive to said output signal for providing a normal indication when the current in said conductor is below a predetermined level and a fault indication when the current in said conductor is greater than said predetermined level, and being of the type comprising, in combination:
input means for receiving said secondary winding of said current transformer;
rectifier means coupled to said input means for providing first and second unidirectional signals respectively at first and second terminals thereof;
impedance means coupled between said terminals for providing said output signal at an intermediate point thereof which is indicative of the level of said current in said conductor;
said impedance means including means for varying the relative impedance of said impedance means wherein the impedance between said intermediate point and said first terminal is substantially greater than the impedance between said intermediate point and said second terminal until the level of said current in said conductor exceeds said predetermined level whereupon the impedance between said intermediate point and said second terminal is substantially greater than the impedance between said intermediate point and said first terminal;
wherein said impedance means includes a threshold device which is substantially nonconductive when the level of said current is less than said predetermined level and which is conductive when the level of said current is greater than said predetermined level, and wherein said threshold device is coupled between said first terminal and said intermediate point and further including a capacitor coupled between said intermediate point and a point of reference potential with respect to said first and second signals; and
means for loading the secondary winding of said transformer to prevent saturation of said transformer at current levels below said predetermined level, the improvements therewith comprising:
first and second diodes serially coupled between said threshold device and said intermediate point;
a resistive divider coupled between the junction of one of said diodes with said threshold device and said point of reference potential, and
wherein said capacitor is coupled between the common junction of said diodes and an intermediate point of said resistive divider.

8. The fault indicator circuit according to claim 7, wherein said resistive divider comprises first and second serially coupled resistors, and wherein the resistance of the one of said resistors which is coupled between said intermediate point of resistive divider and said point of reference potential is substantially less than the resistance of the other of said resistors.

* * * * *